United States Patent
Katrak et al.

(10) Patent No.: US 7,532,526 B2
(45) Date of Patent: May 12, 2009

(54) METHOD AND SYSTEM FOR TESTING ADDRESS LINES

(75) Inventors: Kerfegar K. Katrak, Fenton, MI (US); Hans Chandra, Carmel, IN (US); Timothy A. Wellsand, Peru, IN (US)

(73) Assignee: GM Global Technology Operations, Inc., Detroit, MI (US)

( * ) Notice: Subject to any disclaimer, the term of this patent is extended or adjusted under 35 U.S.C. 154(b) by 28 days.

(21) Appl. No.: 11/873,290

(22) Filed: Oct. 16, 2007

(65) Prior Publication Data

US 2009/0097343 A1 Apr. 16, 2009

(51) Int. Cl.
*G11C 29/00* (2006.01)

(52) U.S. Cl. ............... 365/201; 365/189.07; 714/53; 714/56

(58) Field of Classification Search ........... 714/743
See application file for complete search history.

(56) References Cited

U.S. PATENT DOCUMENTS 6,836,440 B2 * 12/2004 Adler et al. ............... 365/201
6,877,118 B2 * 4/2005 Oshima et al. ............ 714/719
7,085,973 B1 * 8/2006 Yin ........................... 714/718
2007/0204189 A1 * 8/2007 Soetemans ................ 714/718

* cited by examiner

*Primary Examiner*—Tan T. Nguyen

(57) ABSTRACT

Method and systems are described for testing an address line inter-coupling a processor and a memory. The contents of a first address in the memory are initially compared with the contents of a second address in the memory, wherein each of the first and second addresses are addressable in the memory by a different value applied on the address line. If the contents of the first and second addresses match, the contents of either one of the first and second addresses are changed, and a subsequent comparison of the contents of the first and second memory addresses is performed. If the second comparison determines that contents of the first and second memory address still match, then a fault condition associated with the address line is identified.

20 Claims, 3 Drawing Sheets

METHOD AND SYSTEM FOR TESTING ADDRESS LINES

TECHNICAL FIELD

This disclosure relates generally to data processing systems such as those found in vehicles. More particularly, this disclosure relates to testing of address lines used in data processing systems.

BACKGROUND

In any microprocessor-driven system, reliability is an important concern. This is especially true in the vehicle context, where "electronically controlled" braking systems, stability systems, engines, and the like are commonly used to control and improve vehicle performance. As a result, many control systems including those found in cars, trucks and other vehicles commonly include testing features that allow the system to ensure reliable and efficient hardware and software operation. In particular, it is desirable to ensure that the address lines inter-connecting system controller devices, memory, input/output devices or the like are functioning properly, and are not subject to "stuck" values, common mode data errors and/or the like.

It is therefore desirable to provide a system and/or method for testing the integrity of address lines operating within a control system. Further, it is desirable to provide systems and/or methods that are capable of functioning within any relevant security time constraints, and without unduly affecting system throughput.

BRIEF SUMMARY

According to various exemplary embodiments, methods and systems are described for testing an address line intercoupling a processor and a memory. In one embodiment, the contents of a first address in the memory are initially compared with the contents of a second address in the memory, wherein each of the first and second addresses are addressable in the memory by a different value applied on the address line. If the contents of the first and second addresses match, the contents of either one of the first and second addresses are changed, and a subsequent comparison of the contents of the first and second memory addresses is performed. If the second comparison determines that contents of the first and second memory address still match, then a fault condition associated with the address line is identified.

According to another embodiment, a computer program product resides in firmware or another a digital storage medium for testing an address line coupled to a memory having a plurality of addresses. The computer program product comprises means for comparing the contents of a first address in the memory with the contents of a second address in the memory, wherein each of the first and second addresses are addressable in the memory by a different value applied on the address line. The program product also comprises means for changing the contents of either one of the first and second addresses if the contents of the first and second addresses match and for then performing a second comparison of the contents of the first and second memory addresses, and also means for identifying a fault condition associated with the address line if the second comparison determines that contents of the first and second memory address still match.

In yet another embodiment, a data processing system comprises a digital memory having a plurality of addresses each configured for storing digital contents, a plurality of address lines coupled to the digital memory, and a processor. The processor is configured to access the addresses in the digital memory using the plurality of address lines, wherein the processor is configured to test at least one of the plurality of address lines by performing a first comparison of the contents of a first one of the plurality of addresses with the contents of a second one of the plurality of addresses, and, if the contents match, adjusting the contents of one of the first and second addresses and performing a subsequent comparison of the contents of the address, and, if the second comparison identifies that the contents of the first and second addresses still match, indicating a fault condition.

Various aspects and features of these and other embodiments are presented in the detailed description below.

DESCRIPTION OF THE DRAWINGS

The present invention will hereinafter be described in conjunction with the following drawing figures, wherein like numerals denote like elements.

DESCRIPTION OF EXEMPLARY EMBODIMENTS

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
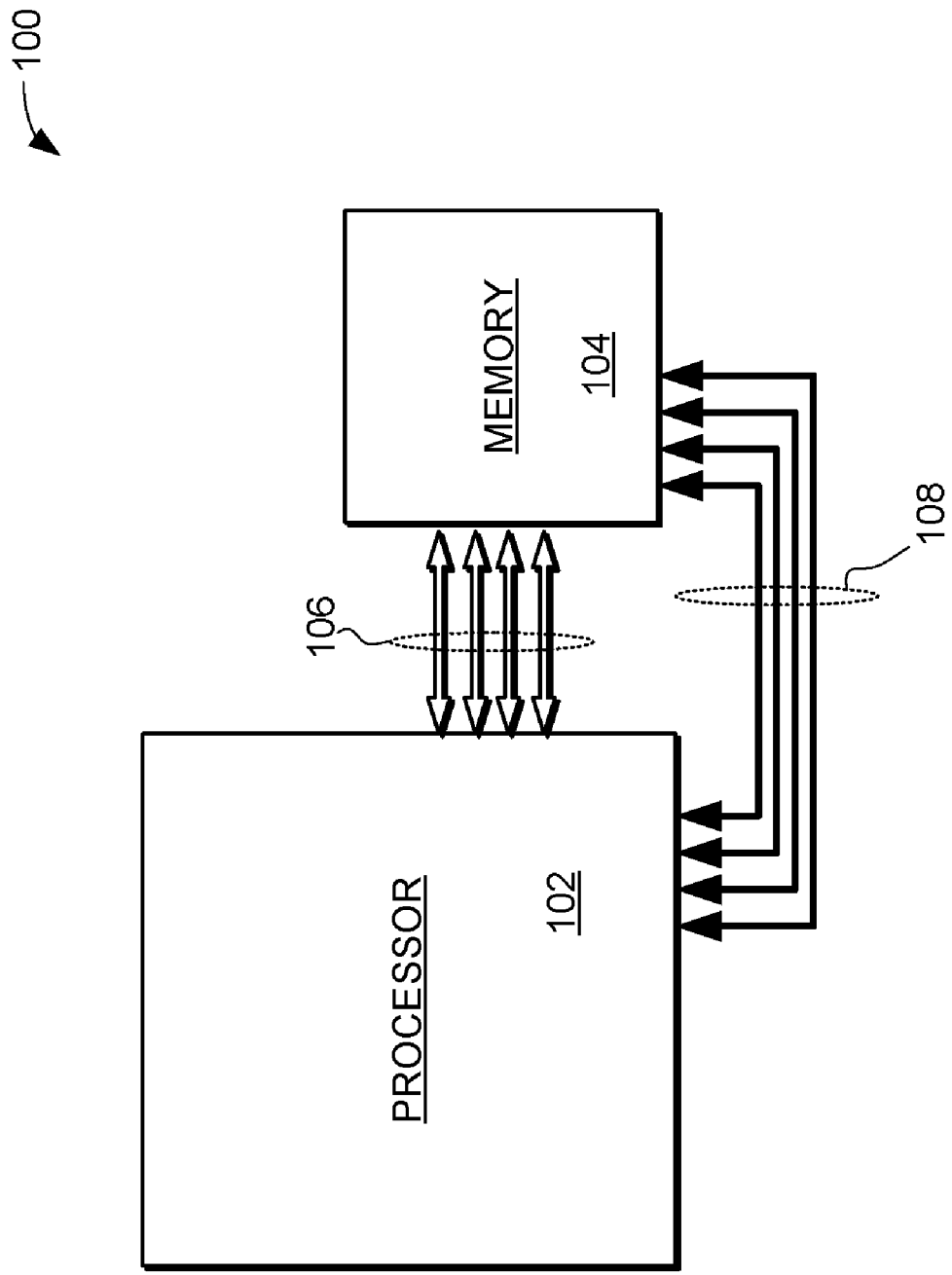
FIG. 1 is a block diagram of an exemplary data processing system.
Figure 2:
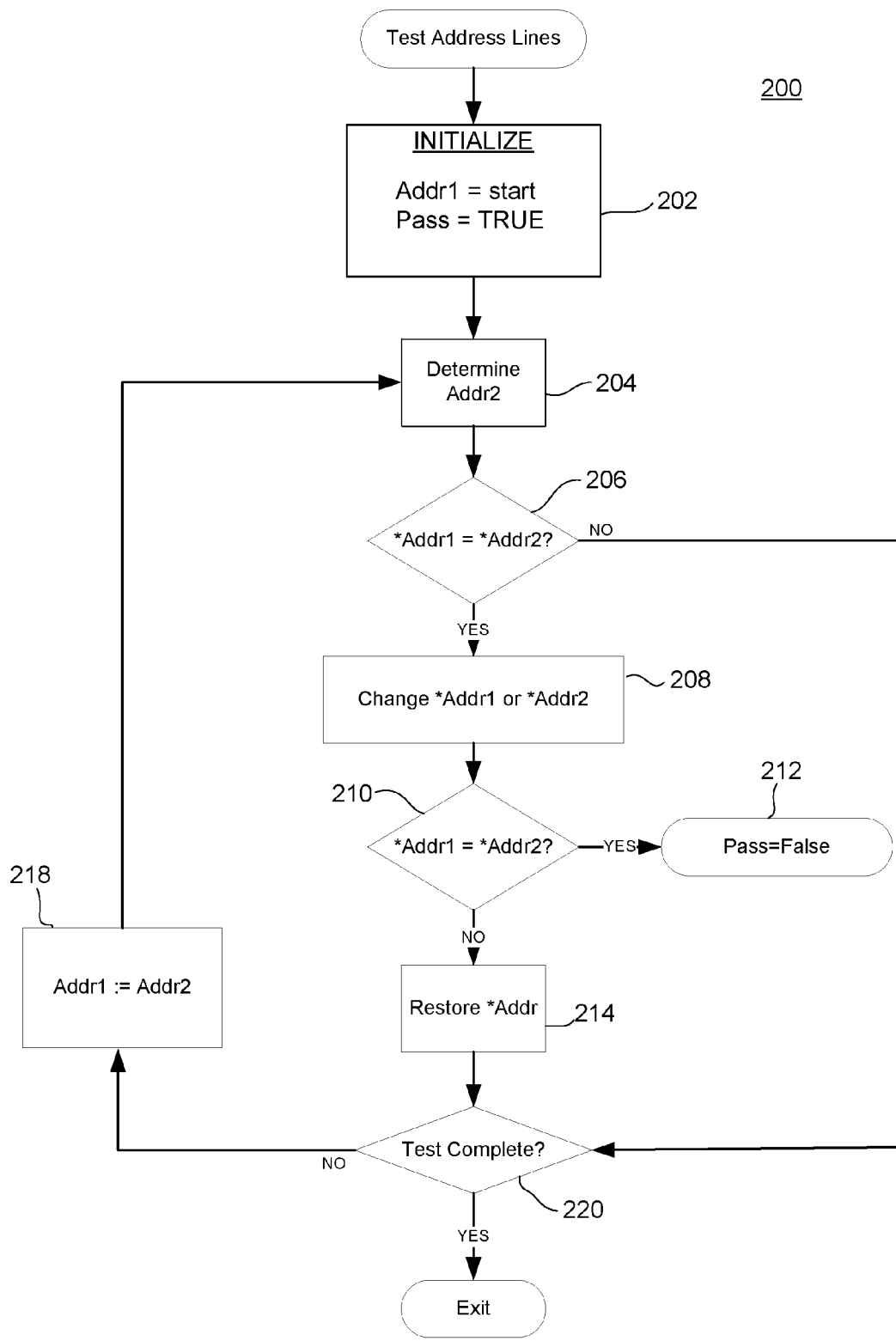
FIG. 2 is a flowchart of an exemplary technique for testing address lines in a data processing system.
Figure 3:
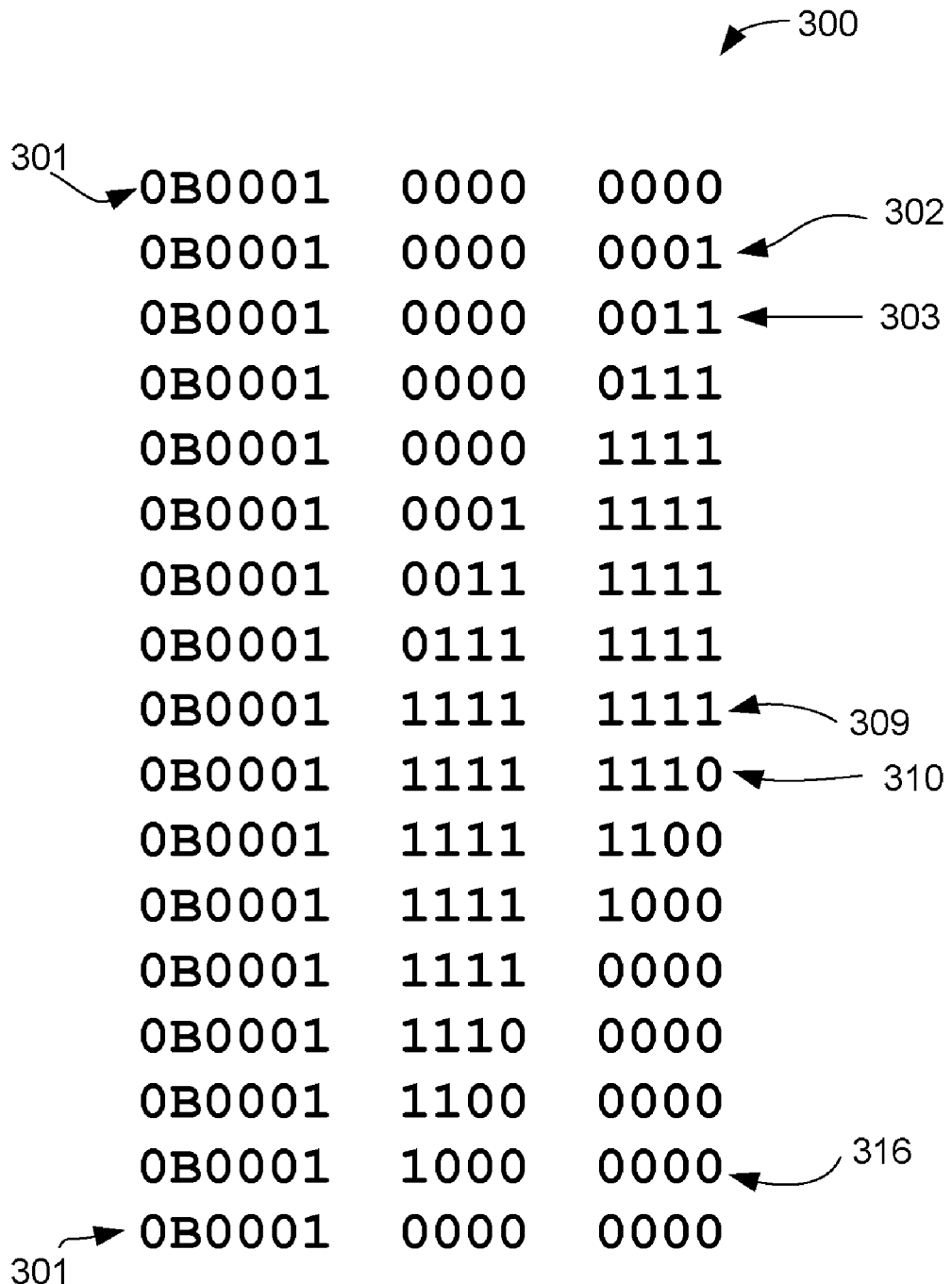
FIG. 3 is a chart of progressive memory addresses that could be used to test the address lines in a data processing system.

FIGS. 1-3 represent exemplary systems and techniques that can be used to test address lines such as those intercoupling a processor and a memory. In various embodiments, the common mode errors and the like relating to address lines can be detected and/or diagnosed within security time constraints, without destroying the contents of memory, and without significantly impacting the throughput of the processor. Though the use of simple comparisons, any address line issues can be identified so that the issue can be flagged, repaired and/or avoided in future operation.

With initial reference to FIG. 1, an exemplary computing system 100 suitably includes a processor 102 communicating with a memory 104 or the like via a set of address lines 106 and a set of data lines 108. In various embodiments, address lines 106 and data lines 108 make up a bus or other arrangement for accessing and sharing data between the various devices (e.g. input/output devices, bus controllers, memory controllers, additional processing or storage devices, etc.) present within system 100. While FIG. 1 only shows two data processing elements 102 and 104, then, other embodiments may include additional or alternate components.

Processor 102 is any microprocessor, microcontroller, programmable array or other device capable of processing digital data and/or instructions. In various embodiments, processor 102 represents a controller for an engine, a stability system, a braking system and/or any other controllable system present on a vehicle. Other embodiments, however, may be found in any sort of control or computing environment, including any sort of personal computing, medical, aerospace, defense and/ or other application. Address lines coupled to any sort of dynamic cache, for example, could be evaluated using the techniques described herein.

Memory 104 is any sort of digital storage device capable of storing digital data in a format that can be addressed for later retrieval. In various embodiments, memory 104 is any sort of random access memory (RAM), read-only memory (ROM), flash memory and/or the like.

Generally speaking, memory 104 communicates with processor 102 and/or other components operating in system 100 via any number of address lines 106. Although only four address lines 106 are shown in FIG. 1 to avoid overly complicating the drawing or the concepts embodied therein, many practical embodiments will support systems 100 with eight, sixteen, thirty-two, sixty-four or any other number of address lines. Although the techniques described below may be used to identify and/or isolate issues on any one particular address line, any number of total address lines could be used.

Memory 104 and processor 106 also communicate via a set of data lines 108 as appropriate. Although only four data lines are shown in FIG. 1, any number of data lines could be provided in an equivalent embodiment. It is not necessary that the number of address and data lines be equal, although this may occur in some embodiments. Typically, certain "addresses" in memory 104 are identified by a value provided on address lines 106, with the resulting value stored in or retrieved from that address provided on data lines 108. Memory 104 therefore typically contains any sort of conventional encoding/decoding circuitry for carrying out the processes of storing and retrieving data under control of processor 102 and/or any other memory controller as appropriate. Various "command" signals may also be provided between components 102 and 104 (e.g. to place memory 104 into a "read" mode or a "write" mode), although these are not shown in FIG. 1 to avoid complicating the drawing and the concepts embodied therein.

Generally speaking, it is desirable to identify any issues with address lines 106 as quickly as possible, as each address line affects the values stored in a relatively large number of memory addresses. If one of the address lines were to develop an electrical short or otherwise become "stuck" at a particular (e.g. high or low) value, for example, data could be written to or read from an improper memory location, thereby causing confusion, delay and/or other adverse effects in system 100. Similar effects could occur if two or more address lines became shorted together.

To determine if one or more address lines 106 have become "stuck" in any way, controller 102 executes an appropriate testing process 200. In various embodiments, process 200 is implemented in logic executing on processor 102 in any manner. Such logic may be implemented with any combination of hardware, software, firmware and/or other logic as appropriate, and may be embodied in any medium. Software instructions for executing process 200 may reside on any sort of memory (including memory 104, or any sort of memory associated with processor 102) or other digital storage medium as appropriate.

FIG. 2 shows an exemplary process 200 for testing address lines coupled to a memory. Process 200 may be implemented in any manner, such as in computer-executable code residing in any sort of volatile or non-volatile memory, or any other digital storage medium. In various embodiments, process 200 is implemented in software code that is stored in firmware or the like associated with processor 102 (FIG. 1). In the process 200 shown in FIG. 2, certain test addresses (corresponding to desirable voltage signals applied to address lines 106) are identified (e.g. steps 202, 204). The contents of those test addresses are compared (step 206) to verify that the contents were retrieved from separate addresses in memory 104. If, for some reason, the contents of the test addresses match (step 206), the contents of either address are manipulated (step 208), and a second comparison is performed (step 210). If the manipulated contents of one address are still determined to match the contents of an address that was not manipulated (step 212), an address line issue is identified. Otherwise, subsequent processing on additional address lines (steps 218, 204) can continue.

Process 200 may be executed on any temporal basis. In various embodiments, process 200 executes at system startup and/or periodically during operation of system 100. In other embodiments, process 200 may be triggered if external logic identifies a potential issue with address lines 106, or any other periodic or aperiodic temporal basis could be used. Process 200 may be called by an external program, for example, that initiates the testing and receives a "pass", "fail" or other result after the testing is complete. In many embodiments, process 200 is simple enough to execute in real time without creating undue overhead on processor 102.

Process 200 suitably begins by initializing any data values, variables, memory locations and/or other factors as appropriate. In the exemplary logic shown in FIG. 2, the process is initially set to return a successful test result unless subsequent processing identifies an issue, although equivalent embodiments could default to the "unsuccessful result" setting as well. In various embodiments, process 200 is provided with any number of parameters such as a starting memory address, a size of the memory block to be tested, and/or any other information as appropriate.

Initialization step 200 may involve other tasks as well. Parameters received from a calling process may be received and/or stored as appropriate. In various embodiments, the calling program provides process 200 with a starting address and/or a memory "block size" for testing. These parameters can be stored in registers or memory associated with processor 102 to select and control the particular address lines that are tested, and/or for other purposes. In various embodiments, "block size" and "start address" parameters are used to determine the starting and stopping points of testing. That is, a stopping address can be identified by simply adding the block size to the start address. Subsequent testing then begins at the start address, and continues until an address under test exceeds the stop address (or that otherwise lies outside of the test block) is identified. Moreover, using a "block size" parameter may improve the robustness of the test routine 200 in various embodiments, since any provided or computed test addresses that lie out of the test block range can be readily identified or dealt with (e.g. by exiting the test routine) without leaving process 200 in a hung or other unknown state.

Additionally, initialization step 200 may involve disabling some or all interrupts on processor 102 while process 200 is executing to prevent an interrupt process from affecting the results of the test. To that end, various embodiments may block interrupts for at least processes that execute in less time than process 200 to prevent interruptions of the testing process.

In the embodiment shown in FIG. 2, at least one of the two test addresses ("Addr1") is initially set to the start address, which may correspond to an upper or lower bound for the memory section under test. The other address ("Addr2") is determined in any convenient manner (step 204). In various embodiments, a particular value (e.g. a logic "1" or "0") is shifted into a prior test address to identify a subsequent test address. In the first iteration of process 200, for example, a "1" (or "0") could be applied to the value of the first test address (Addr1) to obtain the second test address (Addr2). By shifting or otherwise placing particular values in the addresses being evaluated, desired voltages can be applied on the corresponding address lines. Shifting these values across all of the address lines under test, then, can have the effect of verifying that each address line is able to toggle between digital logic states. Additional detail about one technique for selecting memory locations under test is provided below in conjunction with FIG. 3.

Generally speaking, it is desirable to compare the contents of two separate memory locations (e.g. Addr1 and Addr2) to verify address lines leading to the addresses are not "stuck" at any particular value. Since the address lines are driven to desired states though the selection of particularly desired memory locations, it can be determined that the address lines are working properly if it can be verified that the two references to two separate addresses are indeed returning values from two separate addresses in memory 104. That is, if the contents of the two addresses can be shown to be different, it can be readily assumed that the address lines 106 used to reference those addresses are operating properly.

To that end, the contents of the two selected addresses (Addr1 and Addr2) are compared (step 206). If the contents are different, then it can be readily determined that two separate memory locations have been accessed, and therefore the address lines 106 used to reference those locations must be working properly. On the other hand, if the contents of the two addresses are not different, it is not known whether the two addresses are merely storing the same value, or whether the same address is being read twice due to one or more stuck address lines 106.

To determine whether the values stored in the two addresses happen to be equal, the contents of one memory location are temporarily changed through a write command, a shift operation, a bit toggle or any other alteration (step 208). Addr2 may be inverted, for example, for simplicity. In practice, however, any number of equivalent embodiments could change the contents of the other address (e.g. Addr1) in any manner. It is simply desirable to ascertain that the contents of two separate memory addresses are being evaluated; the actual contents of either memory are not important in the simplest embodiments.

After the contents of either memory are manipulated, then, the contents of both addresses are again read from memory 104 and compared (step 210). If the contents previously determined to be equal are now unequal, it can be deduced that this inequality resulted from the bit changes performed in step 208, and that two separate addresses (Addr1 and Addr2) are therefore being evaluated. The contents of the changed address can therefore be restored (step 214), and processing continues as appropriate (step 216). If subsequent testing is desired, one of the prior test addresses may be retained (step 218) and a new address may be selected (e.g. in a subsequent iteration of step 204). Alternatively, two new addresses may be obtained in any manner.

If the comparison 210 results in a continued equality condition, however, despite the changes applied in step 208, it can be determined that a short or other issue exists with one or more address lines (step 212). This information can be used in any manner. In various embodiments, an "error", "fault" or other condition can be flagged for a user or technician. In other embodiments, additional logic can be used to isolate further operation of the affected address line to prevent subsequent use. That is, operations may continue using the non-stuck address lines by simply avoiding memory addresses that require the use of the stuck line. Any other remedial action may be taken in any number of equivalent embodiments.

Testing continues until all of the desired address lines have been tested (step 216). In various embodiments, it is not necessary to test all of the address lines currently in use. To the contrary, addresses containing certain data can be avoided while testing other address lines used for accessing data stored in another portion of memory 104. For example, testing can be applied to the "least significant" address lines without affecting the contents of memory that is accessed only with more significant address lines not under test. Various testing parameters may be formulated and applied in any number of equivalent embodiments.

The particular addresses selected for testing may be determined in any manner. In various embodiments, it is desirable to test each address line by applying both a "high" and a "low" logic state to the line. If the address line is able to successfully apply both a high and a low logic state to memory 104, then the line can be determined to not be stuck or otherwise at issue.

FIG. 3 shows a simplified, albeit effective, technique for selecting address for testing. In the example of FIG. 3, a twelve-bit addressing scheme is used to represent addresses from 0x000 through 0xFFF, but only the "least significant" eight address lines 106 are under test. Because the more significant lines are not affected by this test, only memory locations 0x100 through 0x1FF can be affected by the test. Data stored in other locations would therefore remain unaffected by the testing addresses presented in table 300.

In this example, the "base" or starting address for testing is 0x100, corresponding to binary address 301 in FIG. 3. The operation of each address line in the test space can be evaluated for both a "0" and a "1" value of that address line by simply shifting a "1" into the least significant side of the prior test address. By comparing the contents of address 301 with the contents of address 302, for example, it can be determined that the least significant address line 106 is working properly (for at least 0 to 1 transitions). Continuing to shift in bits in subsequent transactions (e.g. subsequently comparing address 302 to address 303, for example, and then address 303 to 304, and so on) can continue until all of the address lines 106 under test are complete. Address 309, for example, applies the inverse voltages of address 301 in this embodiment, thereby ensuring that all of the address lines under test have successfully toggled from a "0" to a "1" logic state.

In subsequent operation starting with address 310, an opposing value (e.g. a "0") can be shifted into the test address to verify a successful "high to low" transition. Successfully comparing the contents of addresses 309 and 310, for example, ensures that the least significant address line 106 can successfully complete a "1 to 0" transition. Continuing to shift in opposing values for subsequent test addresses though address 316 applies similar verification to the other lines. Note that shifting a low value into address 316 results in the original "base" address 301. Detecting the occurrence of the original test address can be used to exit the testing sequence in various embodiments, since the recurrence of the original state means that all of the address lines under test have been set and reset for a complete test.

The particular scheme shown in FIG. 3 may be readily modified in any manner, and/or may be applied to any number of equivalent embodiments. In particular, the concepts of "setting" or "resetting" certain address bits can be fully exploited to test the application of high and/or low voltage on any address line, including any line in any addressing scheme having sixteen, thirty-two, sixty-four or any other number of address lines 106.

While at least one example embodiment has been presented in the foregoing detailed description, it should be appreciated that a vast number of variations exist. It should also be appreciated that the example embodiment or example embodiments are not intended to limit the scope, applicability, or configuration of the invention in any way. Rather, the foregoing detailed description will provide those skilled in the art with a convenient road map for implementing the inventive aspects that may be found in at least one embodiment. The subject matter of the invention includes all combinations and sub-combinations of the various elements, features, functions and/or properties disclosed in the example embodiments. It should be further understood that various changes can be made in the function and arrangement of elements without departing from the scope of the invention as defined in the appended claims and the legal equivalents thereof.

What is claimed is:

1. A method of testing an address line coupled to a memory having a plurality of addresses, the method comprising the steps of:
    comparing the contents of a first address in the memory with the contents of a second address in the memory, wherein each of the first and second addresses are addressable in the memory by a different value applied on the address line; and
    if the contents of the first and second addresses match, then changing the contents of either one of the first and second addresses and performing a second comparison of the contents of the first and second memory addresses, and, if the second comparison determines that contents of the first and second memory address still match, then identifying a fault condition associated with the address line.

2. The method of claim 1 wherein the changing step comprises performing a bitwise operation on the either one of the first and second addresses.

3. The method of claim 2 wherein the bitwise operation is a bit inversion operation.

4. The method of claim 1 further comprising the step of restoring the contents of either one of the first and second addresses following the changing step.

5. The method of claim 1 wherein the address line is one of a plurality of address lines, and wherein the comparing and changing steps are repeated for different values of the first and second memory addresses until each of the plurality of address lines have been evaluated.

6. The method of claim 5 wherein the second address becomes the first address following the repeating step.

7. The method of claim 6 wherein the second address following the repeating step corresponds to the second address prior to the repeating step, but with a single bit shift in value.

8. The method of claim 7 wherein the single bit shift is performed from the least significant bit of the address.

9. The method of claim 7 wherein the single bit shift is performed from the most significant bit of the address.

10. The method of claim 7 wherein the single bit shift comprises shifting a "1" into the prior second address.

11. The method of claim 7 wherein the single bit shift comprises shifting a "0" into the prior second address.

12. The method of claim 7 wherein single bit shift comprises shifting a "1" into the prior second address for a first number of repetitions of the comparing and changing steps, and then shifting a "0" into the prior second address for a second number of repetitions of the comparing and changing steps.

13. The method of claim 12 wherein the first and second numbers of repetitions are equal to each other.

14. The method of claim 7 wherein single bit shift comprises shifting a "0" into the prior second address for a first number of repetitions of the comparing and changing steps, and then shifting a "1" into the prior second address for a second number of repetitions of the comparing and changing steps.

15. A computer program product residing in a digital storage medium for testing an address line coupled to a memory having a plurality of addresses, the computer program product comprising:
    means for comparing the contents of a first address in the memory with the contents of a second address in the memory, wherein each of the first and second addresses are addressable in the memory by a different value applied on the address line; and
    means for changing the contents of either one of the first and second addresses if the contents of the first and second addresses match and for then performing a second comparison of the contents of the first and second memory addresses; and
    means for identifying a fault condition associated with the address line if the second comparison determines that contents of the first and second memory address still match.

16. A data processing system comprising:
    a digital memory having a plurality of addresses each configured for storing digital contents;
    a plurality of address lines coupled to the digital memory; and
    a processor configured to access the addresses in the digital memory using the plurality of address lines, wherein the processor is configured to test at least one of the plurality of address lines by performing a first comparison of the contents of a first one of the plurality of addresses with the contents of a second one of the plurality of addresses, and, if the contents match, adjusting the contents of one of the first and second addresses and performing a subsequent comparison of the contents of the address, and, if the second comparison identifies that the contents of the first and second addresses still match, indicating a fault condition.

17. The system of claim 16 wherein the first and second addresses are selected such each address is referenced with a different value applied to the at least one of the plurality of address lines that is under test.

18. The system of claim 16, wherein the processor is configured to evaluate at least some of the plurality of address lines by repeating the first and subsequent comparisons for a plurality of first and second addresses that are each associated with one of the plurality of address lines.

19. The system of claim 16 wherein the processor is a controller for a vehicle component.

20. The system of claim 16 wherein the processor is a controller for a vehicle stability control system.

* * * * *